US011329158B2

(12) United States Patent
Wang et al.

(10) Patent No.: US 11,329,158 B2
(45) Date of Patent: May 10, 2022

(54) THREE PART SOURCE/DRAIN REGION STRUCTURE FOR TRANSISTOR

(71) Applicant: GLOBALFOUNDRIES U.S. Inc., Santa Clara, CA (US)

(72) Inventors: Halting Wang, Clifton Park, NY (US); Judson R. Holt, Ballston Lake, NY (US); Sipeng Gu, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 171 days.

(21) Appl. No.: 16/843,421

(22) Filed: Apr. 8, 2020

(65) Prior Publication Data

US 2021/0320207 A1    Oct. 14, 2021

(51) Int. Cl.
*H01L 21/00* (2006.01)
*H01L 29/78* (2006.01)
*H01L 29/66* (2006.01)
*H01L 21/02* (2006.01)

(52) U.S. Cl.
CPC .... *H01L 29/7848* (2013.01); *H01L 21/02293* (2013.01); *H01L 29/6656* (2013.01); *H01L 29/66583* (2013.01); *H01L 29/66621* (2013.01); *H01L 29/7856* (2013.01)

(58) Field of Classification Search
CPC .......... H01L 29/7848; H01L 21/02293; H01L 29/6656; H01L 29/66583; H01L 29/66621; H01L 29/7856
See application file for complete search history.

(56) References Cited

U.S. PATENT DOCUMENTS

| | | | |
|---|---|---|---|
| 11,133,417 B1 * | 9/2021 | Gu | ...................... H01L 29/0847 |
| 11,164,795 B2 * | 11/2021 | Gu | ...................... H01L 29/785 |
| 2015/0255543 A1 | 9/2015 | Cheng et al. | |
| 2015/0332972 A1 | 11/2015 | Wu et al. | |
| 2019/0148492 A1 | 5/2019 | Yong et al. | |

* cited by examiner

*Primary Examiner* — Richard A Booth
(74) *Attorney, Agent, or Firm* — Francois Pagette; Hoffman Warnick LLC

(57) ABSTRACT

A structure for a field-effect transistor includes a semiconductor body, a first gate structure extending over the semiconductor body, and a second gate structure extending over the semiconductor body. A recess is in the semiconductor body between the first and second gate structures. A three part source/drain region includes a pair of spaced semiconductor spacers in the recess; a first semiconductor layer laterally between the pair of semiconductor spacers; and a second semiconductor layer over the first semiconductor layer. The pair of spaced semiconductor spacers, the first semiconductor layer and the second semiconductor layer may all have different dopant concentrations.

19 Claims, 10 Drawing Sheets

THREE PART SOURCE/DRAIN REGION STRUCTURE FOR TRANSISTOR

BACKGROUND

The present disclosure relates to transistor fabrication, and more specifically, to a structure for a transistor and method of forming the structure where the structure includes a three part source/drain region. The different parts of the source/drain region may each have a different dopant concentration.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a semiconductor body and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistors ("FinFETs") are formed by creating a number of semiconductor fins on a substrate and placing a gate conductor perpendicularly across the fins. A FinFET is created by the gate forming a channel region below the gate in the fin, and source/drain regions formed in the fin aside the gate.

One challenge with advanced technology nodes is forming source/drain regions between adjacent gate structures for integrated circuits having transistors with different gate pitches. More particularly, where source/drain regions epitaxially fill satisfactorily for shorter gate structures having shorter gate pitches, the relatively larger lateral space between longer gate structures may pose a source/drain region underfill issue. For example, for longer gate structures with relatively larger gate pitch, it may be difficult to create source/drain regions between adjacent gate structures with desired volume and with a planar upper surface. The lack of volume and/or lack of planar surface can lead to performance degradation such as: increased short-channel effects, higher contact resistance and poor effective capacitance.

SUMMARY

Aspects of the disclosure are directed to a structure for a field-effect transistor, the structure comprising: a semiconductor body; a first gate structure extending over the semiconductor body; a second gate structure extending over the semiconductor body; a recess defined in the semiconductor body between the first and second gate structures; a pair of spaced semiconductor spacers in the recess; a first semiconductor layer laterally between the pair of spaced semiconductor spacers; and a second semiconductor layer over the first semiconductor layer.

Further aspects of the disclosure are related to a field-effect transistor, comprising: a semiconductor body; a gate structure extending over the semiconductor body; a recess defined in the semiconductor body adjacent the gate structure; and a source/drain region in the recess, the source/drain region including: a pair of spaced semiconductor spacers in the recess; a first semiconductor layer laterally between the pair of spaced semiconductor spacers; and a second semiconductor layer over the first semiconductor layer.

Additional aspects of the disclosure include a method of forming a structure for a field effect transistor, the method comprising: forming a first gate structure and a second gate structure extending over a semiconductor body, the first gate structure laterally spaced from the second gate structure; forming a recess in the semiconductor body between the first and second gate structures; forming a pair of spaced semiconductor spacers in the recess and between the first and second gate structures; forming a first semiconductor layer laterally between the pair of spaced semiconductor spacers; and forming a second semiconductor layer over the first semiconductor layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
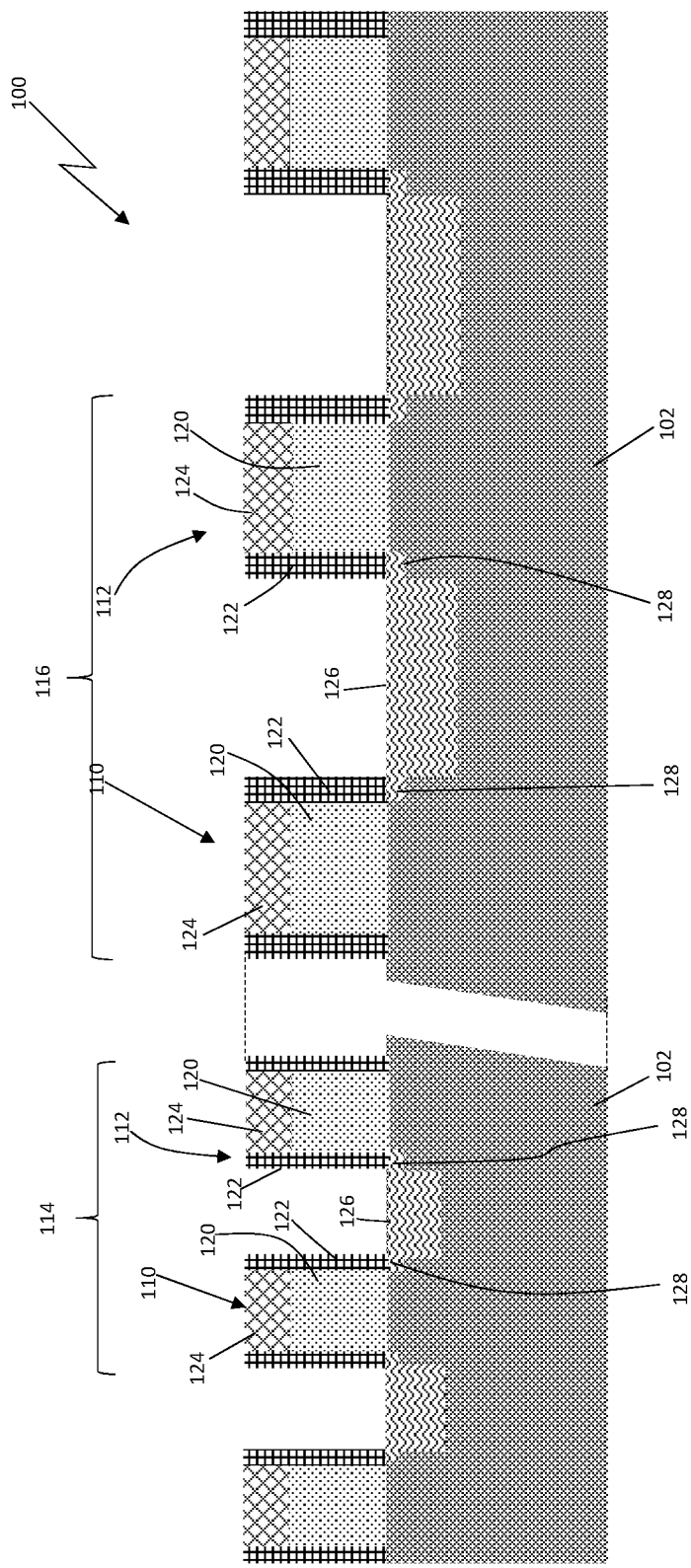
FIG. 1 shows a cross-sectional view of a preliminary structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present disclosure, and it is to be understood that other embodiments may be used and that changes may be made without departing from the scope of the present disclosure. The following description is, therefore, merely illustrative.

It will be understood that when an element such as a layer, region, body, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure for a field-effect transistor (FET). The structure may include a semiconductor body, a first gate structure extending over the semiconductor body, and a second gate structure extending over the semiconductor body. A recess is in the semiconductor body between the first and second gate structures. A three part source/drain region may include: a pair of spaced semiconductor spacers in the recess; a first semiconductor layer laterally between the pair of semiconductor spacers; and a second semiconductor layer over the first semiconductor layer. The pair of spaced semiconductor spacers, the first semiconductor layer and the second semiconductor layer may all have different dopant concentrations, and may be epitaxially grown. Each part of three part source/drain region provides certain advantages. The pair of spaced semiconductor spacers may provide improved short channel effect, and also create a decreased effective lateral spacing between gate structures. The first semiconductor layer provides lower contact resistance, e.g., by providing increased source/drain volume. The second semiconductor layer may provide improved epitaxial uniformity and improved effective capacitance.

Referring to FIGS. 1-10, a method of forming a structure for FET will now be described, starting with a preliminary structure 100. Preliminary structure 100 includes a semiconductor body 102. Semiconductor body 102 may include any now known or later developed form of semiconductor substrate used to create an active region for a transistor device. For example, semiconductor body 102 may include a bulk substrate, a fin, a nanowire, etc. For purposes of description, semiconductor body 102 may be a semiconductor fin. Semiconductor body 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor body 102 may be strained.

FIG. 1 also shows forming a first gate structure 110 and a second gate structure 112 extending over semiconductor body 102. First gate structure 110 is laterally spaced from second gate structure 112. For comparison purposes, each figure shows a cross-sectional view across gate structures including sets of short gate structures 114 on the left side and sets of long gate structures 116 on the right side. It is understood that sets of different length gate structures 114, 116, i.e., short and long channel devices, may be exposed to the same processing but are in different locations within an integrated circuit. Sets 114, 116 may be electrically isolated from one another, e.g., trench isolations (not shown).

Gate structures 110, 112 may include any now known or later developed gate structure. In one example, where a replacement metal gate (RMG) process is used, gate structures 110, 112 may be in the form of dummy gate structures, which are used as part of a replacement metal gate (RMG) process. In this case, as understood in the field, gate structures 110, 112 may include a body 120 including a sacrificial material such as but not limited to amorphous silicon or polysilicon. Gate spacers 122 may be located on the sides of body 120. Gate spacers 122 may include any now known or later developed gate spacer material such as silicon nitride. A cap 124 may be on top of body 120, and may include any now known or later developed cap material, such as silicon nitride. It will be recognized that gate structures 110, 112 may take a number of other forms where the RMG process is not employed such as but not limited to metal gates (i.e., in a gate first process). Regardless of gate structure formation process, gate structures 110, 112 may be formed using any now known or later developed gate formation techniques.

FIG. 1 also shows an optional step of doping semiconductor body 102 with a dopant between first and second gate structures 110, 112 to form a doped section 126 to eventually be a source/drain region extension under gate spacers 122, i.e., prior to recessing into semiconductor body 102 for source/drain region formation. The doping may include one or more doping processes, e.g., ion implanting, to form the illustrated structure. As illustrated, doped section 126 may include source/drain region extension 128 that extend under each gate spacer 122. That is, areas under gate spacers 122 will eventually create source/drain extensions 128. Depending on the type of device to be built, e.g., NFET or PFET, the dopant may vary. For purposes of description, the dopant may be phosphorous (P) for an NFET device.

Figure 2:
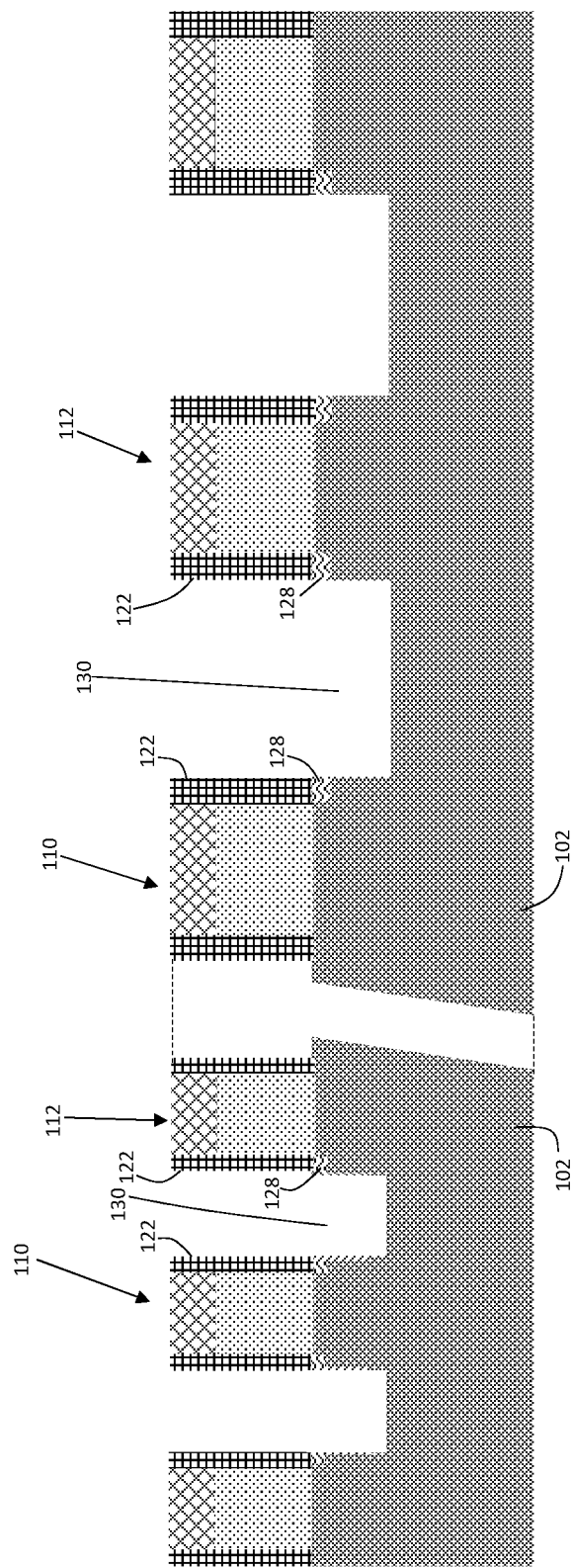
FIG. 2 shows a cross-sectional view of a forming a recess in a semiconductor body, according to embodiments of the disclosure.

FIG. 2 shows forming a recess 130 in semiconductor body 102 between first and second gate structures 110, 112. Recess 130 forming may include performing any appropriate etching process for semiconductor body 102. Spacers 122 direct the etching. Etching generally refers to the removal of material from a substrate (or structures formed on the substrate), and is often performed with a mask in place (not shown) so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Here, for example, a RIE may be employed.

Figure 3:
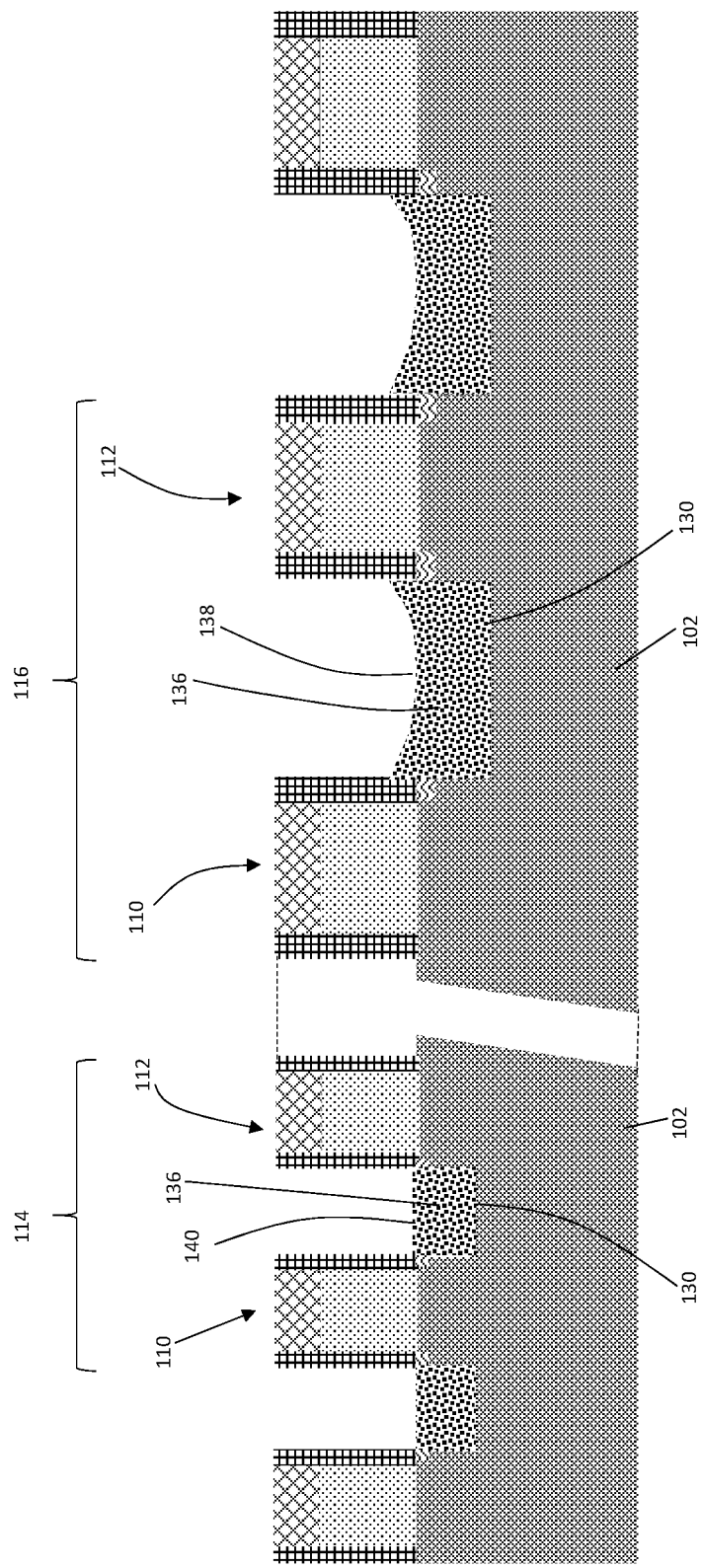
FIG. 3 shows a cross-sectional view of a forming a semiconductor member in the recess, according to embodiments of the disclosure.

FIGS. 3-6 show forming a pair of spaced semiconductor spacers 134 (FIG. 5) in recess 130 and between first and second gate structures 110, 112. As shown in FIG. 3, this process may include epitaxially growing a semiconductor member 136 in recess 130. The terms "epitaxial growth" and "epitaxially formed and/or grown" mean the growth of a semiconductor material on a deposition surface of a semiconductor material, e.g., semiconductor body 102, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. In some embodiments, as illustrated, epitaxial growth processes may be selective to forming on semiconductor surfaces, and may not deposit material on dielectric surfaces, such as silicon dioxide or silicon nitride surfaces. Semiconductor member 136 may include the same semiconductor material as semiconductor body 102. Notably, due to the larger pitch between gate structures 110, 112 in set of gate structures 116 (right side), semiconductor member 136 in recess 130 may have a concave upper surface 138 compared to a planar upper surface 140 of gate structures 110, 112 in set of gate structures 114. Concave upper surface 138 is caused by underfill, and can lead to a number of performance issues, as described herein. Semiconductor member 136 may include a dopant, e.g., phosphorous. Semiconductor member 136 may be doped in any manner, e.g., by in-situ doping during formation or by ion implanting. As will be further described herein, semiconductor member 136 may have a relatively low dopant concentration compared to other doped semiconductor materials of the structure.

Figure 4:
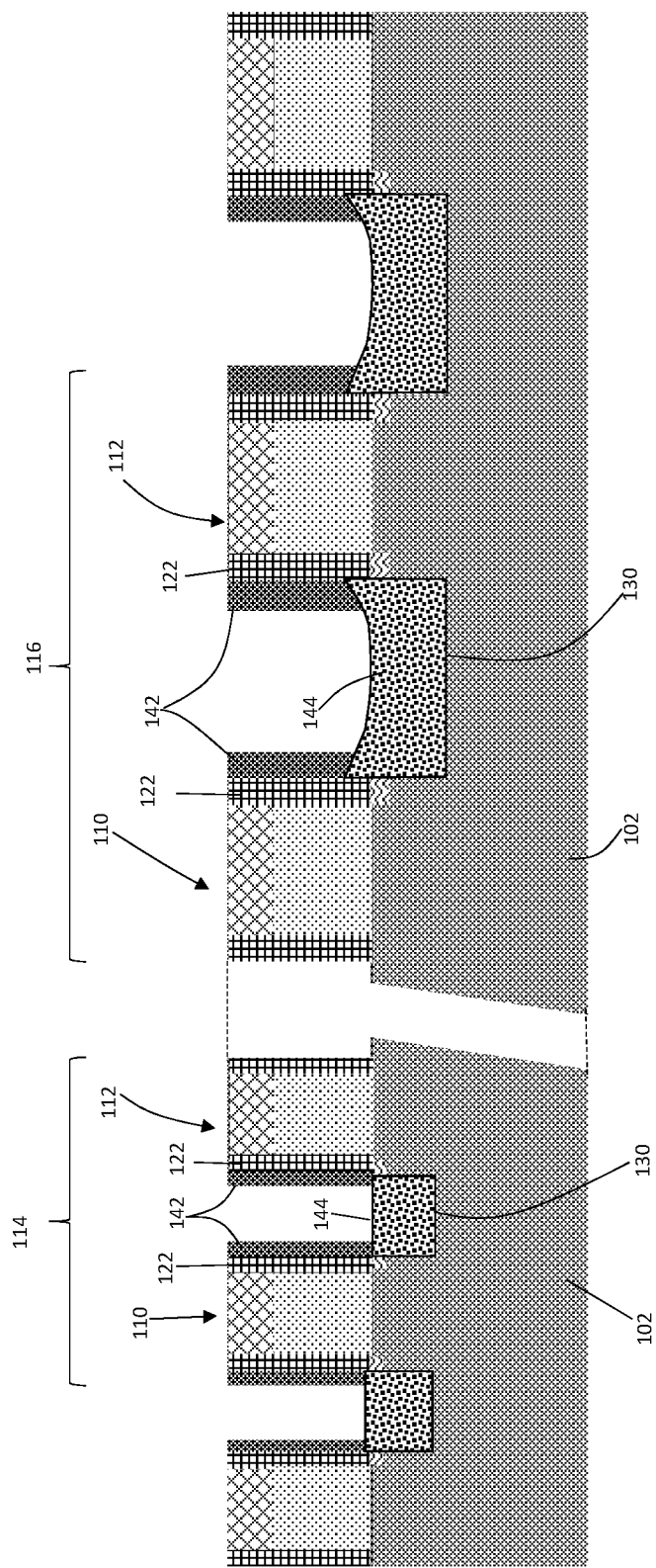
FIG. 4 shows a cross-sectional view of a forming mask, according to embodiments of the disclosure.

FIG. 4 shows forming a mask 142 along sidewalls of first and second gate structures 110, 112. More particular, mask 142 is formed along gate spacers 122 of gate structures 110, 112. Mask 142 may include, for example, silicon oxide, and may be formed by depositing a layer of silicon oxide and etching to leave mask 142. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, mask 142 may be deposited using ALD, and etched, for example, using a RIE. A width of mask 142 can be sized to a desired dimension by controlling various parameter(s) of the etch process, e.g., chemistry, duration, etc.

Figure 5:
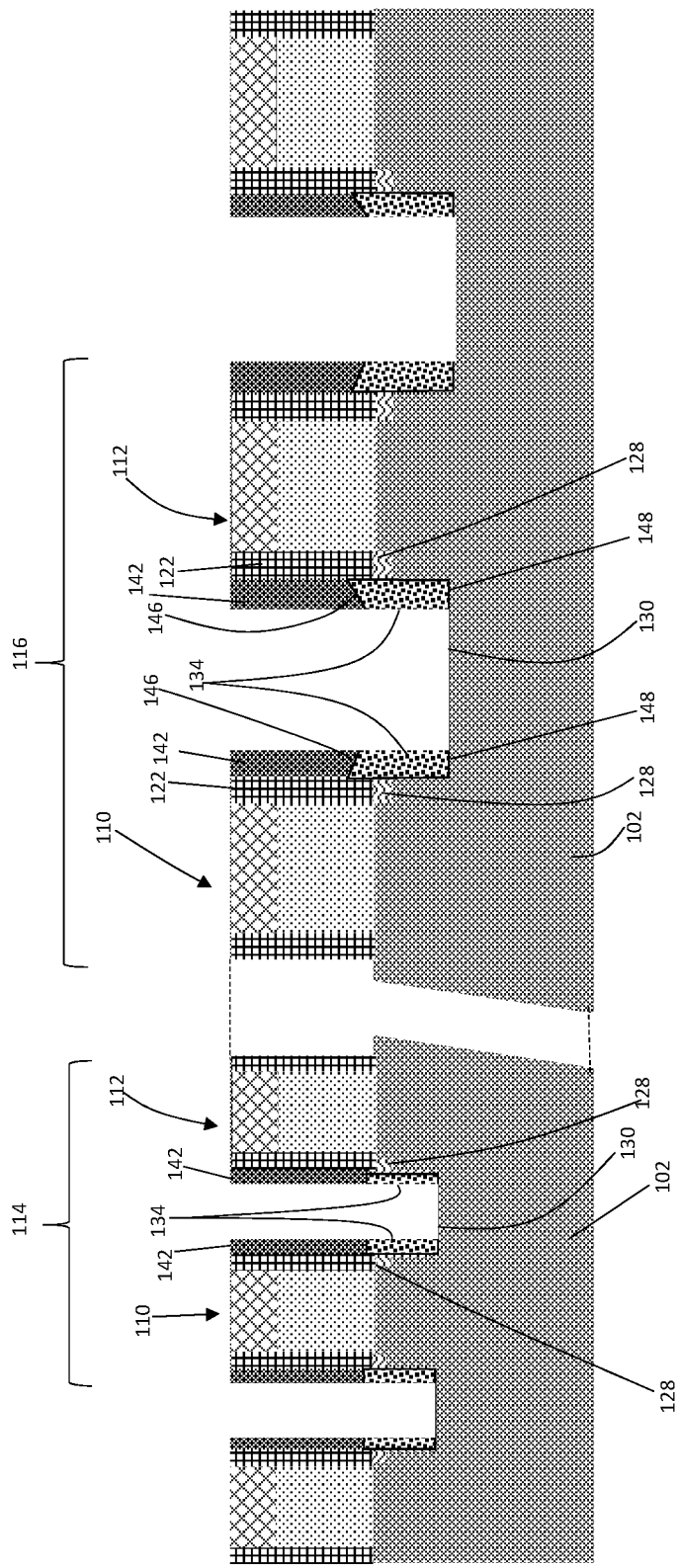
FIG. 5 shows a cross-sectional view of etching to remove exposed portions of the semiconductor member to form semiconductor spacers, according to embodiments of the disclosure.
Figure 6:
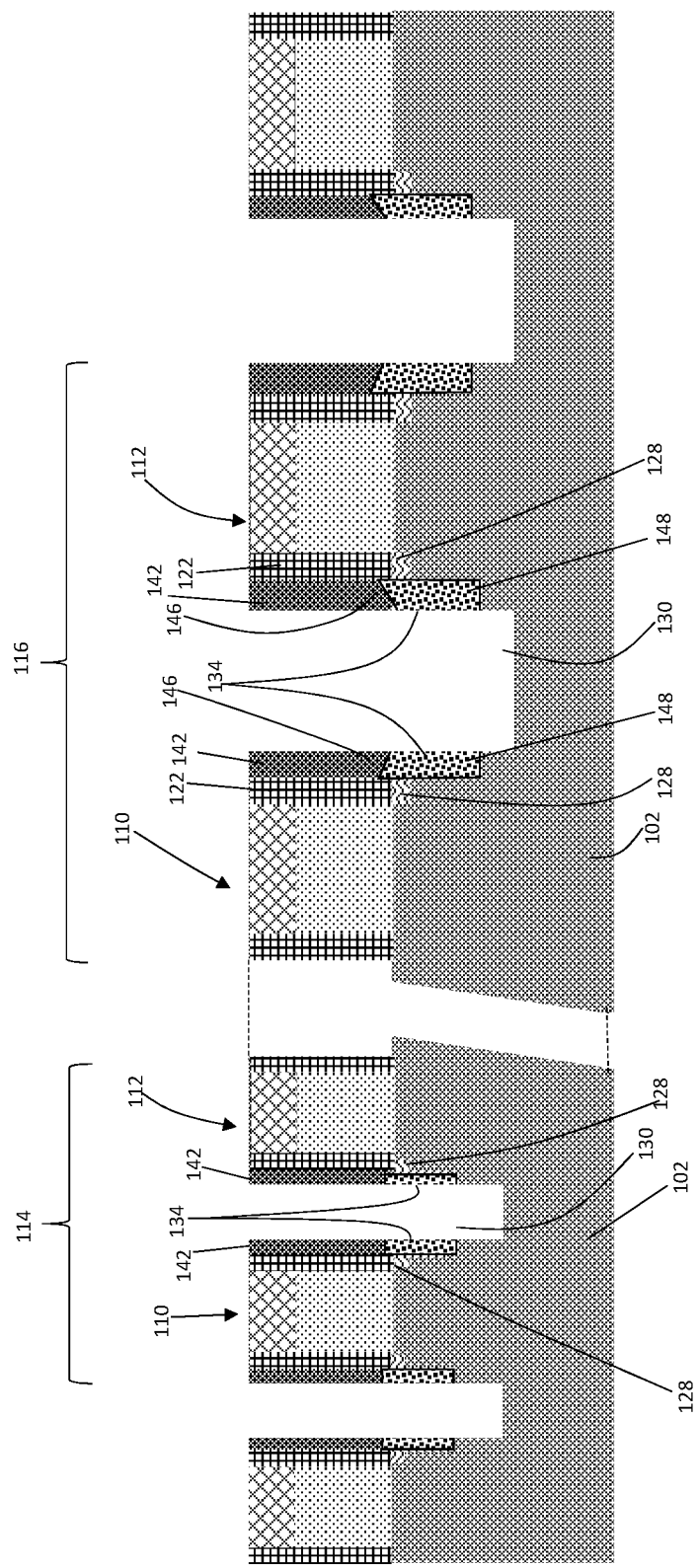
FIG. 6 shows a cross-sectional view of optionally etching into the semiconductor body to enlarge the recess therein, according to embodiments of the disclosure.

FIG. 5 shows etching to remove an exposed portion 144 (FIG. 4) of semiconductor member 136 (FIG. 4) and form a pair of spaced semiconductor spacers 134 (hereafter "semiconductor spacers 134"). The etching may include any appropriate etch chemistry for semiconductor body 102, e.g., a RIE. Semiconductor spacers 134 may have the width of mask 142. Semiconductor spacers 134 have a dopant concentration as dictated by the doping process of semiconductor member 136, e.g., doping depth, distribution, etc. Thus, semiconductor spacers 134 may have a relatively low dopant concentration. In one non-limiting example, the dopant concentration may be between $1 \times 10^{19}$ and $1 \times 10^{20}$ atoms per cubic centimeter (atoms/cm$^3$). As shown, where semiconductor body 136 has concave upper surface 138 (FIG. 4), the resulting pair of semiconductor spacers 134 (right side only in FIG. 5) may have an upper surface 146 at a non-perpendicular angle relative to a sidewall of an adjacent gate structure 110, 112, e.g., sidewall of gate spacers 122. In FIG. 5, etching to remove exposed portion 144 (FIG. 4) of semiconductor member 136 (FIG. 4) to form semiconductor spacers 134 stops at or near a lower surface 148 of semiconductor spacers 134, i.e., at or near bottom of initial recess 130. In an alternative embodiment, shown in FIG. 6, etching to remove exposed portion 144 (FIG. 4) of semiconductor member 136 (FIG. 4) to form semiconductor spacers 134 may continue below lower surface 148 (FIG. 5) of semiconductor spacers 134. That is, the etching continues to remove part of semiconductor body 102 by etching beyond lower surface 148 of spacers 134, i.e., beyond the lowest level of initial recess 130 (FIG. 5). The depth beyond lower surface 148 can be user selected to provide a desired volume for eventual epitaxy filling to create source/drain regions, as will be described herein. As shown in FIGS. 5 and 6, source/drain extension 128 may remain, and extend under each gate spacer 122. Dopants of source/drain extensions 128 are also laterally adjacent each of pair of semiconductor spacers 134, and eventually form part of the source/drain region. For purposes of brevity, the remainder of the method will be described relative to the FIG. 5 embodiment only; the method is equally applicable to the FIG. 6 embodiment.

Figure 7:
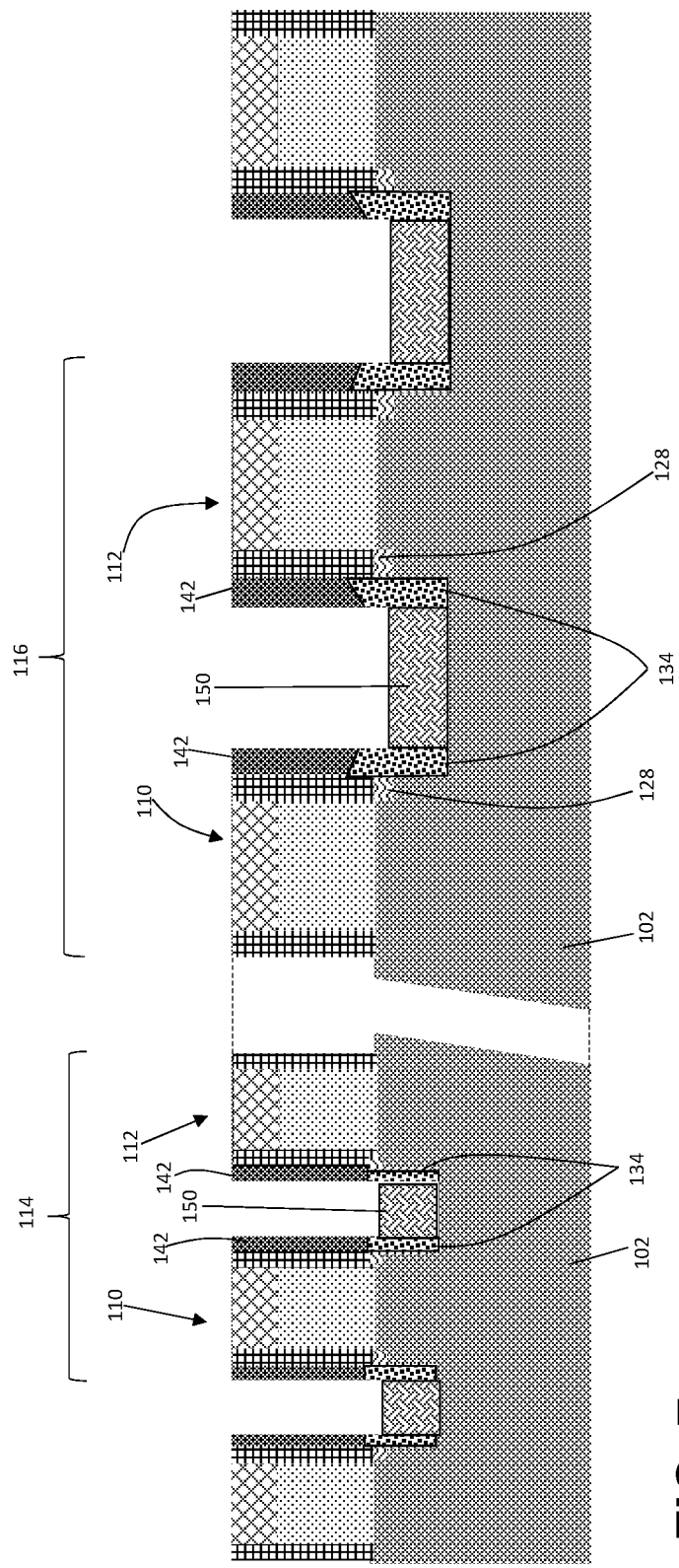
FIG. 7 shows a cross-sectional view of forming a first semiconductor layer, according to embodiments of the disclosure.

FIG. 7 shows forming a first semiconductor layer 150 laterally between pair of semiconductor spacers 134. First semiconductor layer 150 may be formed, for example, by epitaxial growth, and may include the same semiconductor material as semiconductor body 102. Forming first semiconductor layer 150 may include doping at a dopant concentration different than that of semiconductor spacers 134. The dopant in first semiconductor layer 150 may include the same dopant as in semiconductor spacers 134, for example, phosphorous. First semiconductor layer 150 may be doped in any manner, e.g., by in-situ doping during formation or by ion implanting. In one embodiment, first semiconductor layer 150 may have a relatively high dopant concentration. In one non-limiting example, first semiconductor layer 150 may have dopant concentration greater than $1 \times 10^{21}$ atoms/cm$^3$.

Figure 8:
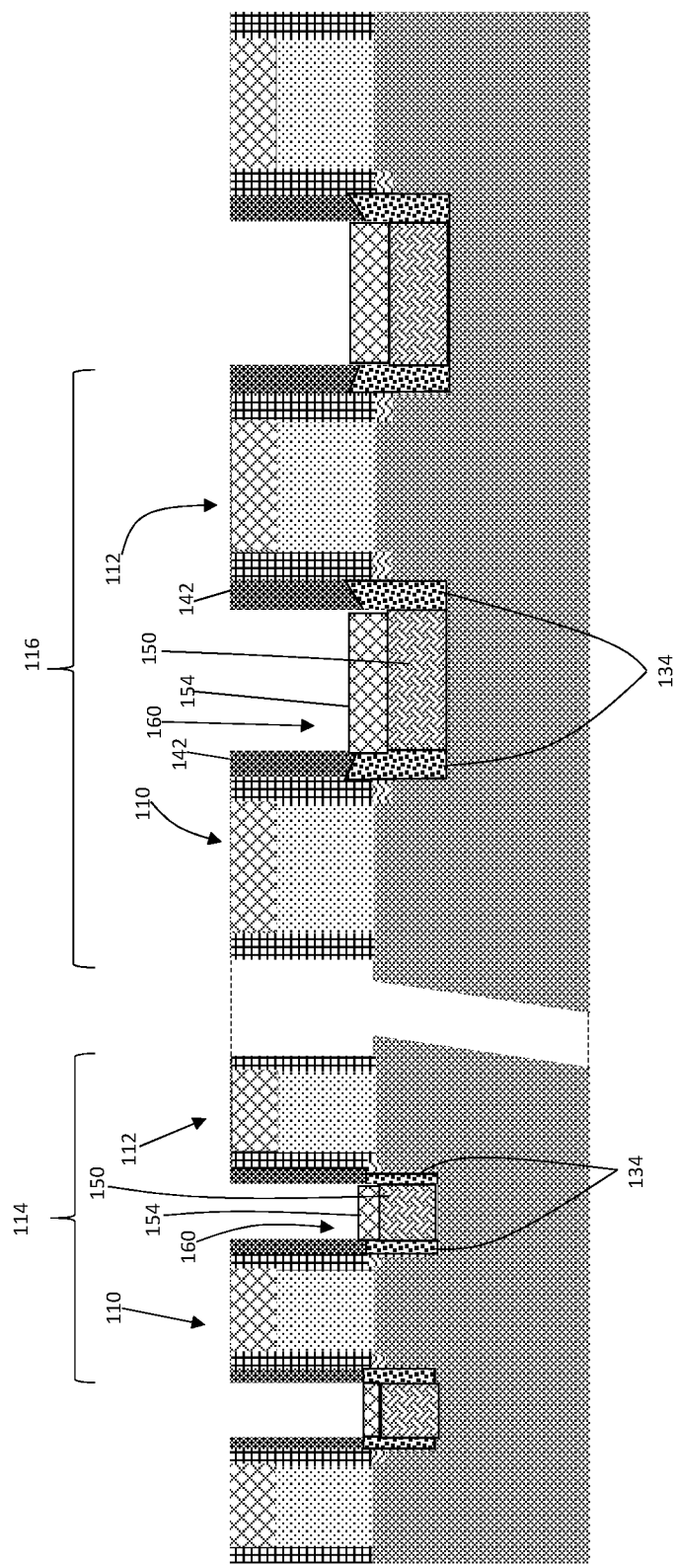
FIG. 8 shows a cross-sectional view of forming a second semiconductor layer, according to embodiments of the disclosure.

FIG. 8 shows forming a second semiconductor layer 154 over first semiconductor layer 150. Second semiconductor layer 154 may be formed, for example, by epitaxial growth, and may include the same semiconductor material as semiconductor body 102. Forming second semiconductor layer 154 may include doping at a dopant concentration different than that of semiconductor spacers 134 and first semiconductor layer 150. The dopant in second semiconductor layer 154 may include the same dopant as in semiconductor spacers 134 and first semiconductor layer 150, for example, phosphorous. Second semiconductor layer 154 may be doped in any manner, e.g., by in-situ doping during formation or by ion implanting. In one embodiment, second semiconductor layer 154 may have a relatively low dopant concentration. In one non-limiting example, second semiconductor layer 154 may have dopant concentration of less than $1 \times 10^{19}$ atoms/cm$^3$.

As described, forming semiconductor spacers 134 includes doping at a first dopant concentration, forming first semiconductor layer 50 includes doping at a second dopant concentration, and forming second semiconductor layer 154 includes doping at a third dopant concentration, resulting in a three part source/drain region 160 (FIG. 8) with dopant concentrations that are all different. Based on the described examples, the dopant concentration of semiconductor spacers 134 may be between $1 \times 10^{19}$ and $1 \times 10^{20}$ atoms/cm$^3$, the dopant concentration of first semiconductor layer 150 may be greater than $1 \times 10^{21}$ atoms/cm$^3$, and the dopant concentration of second semiconductor layer 154 may be less than $1 \times 10^{19}$ atoms/cm$^3$.

Figure 9:
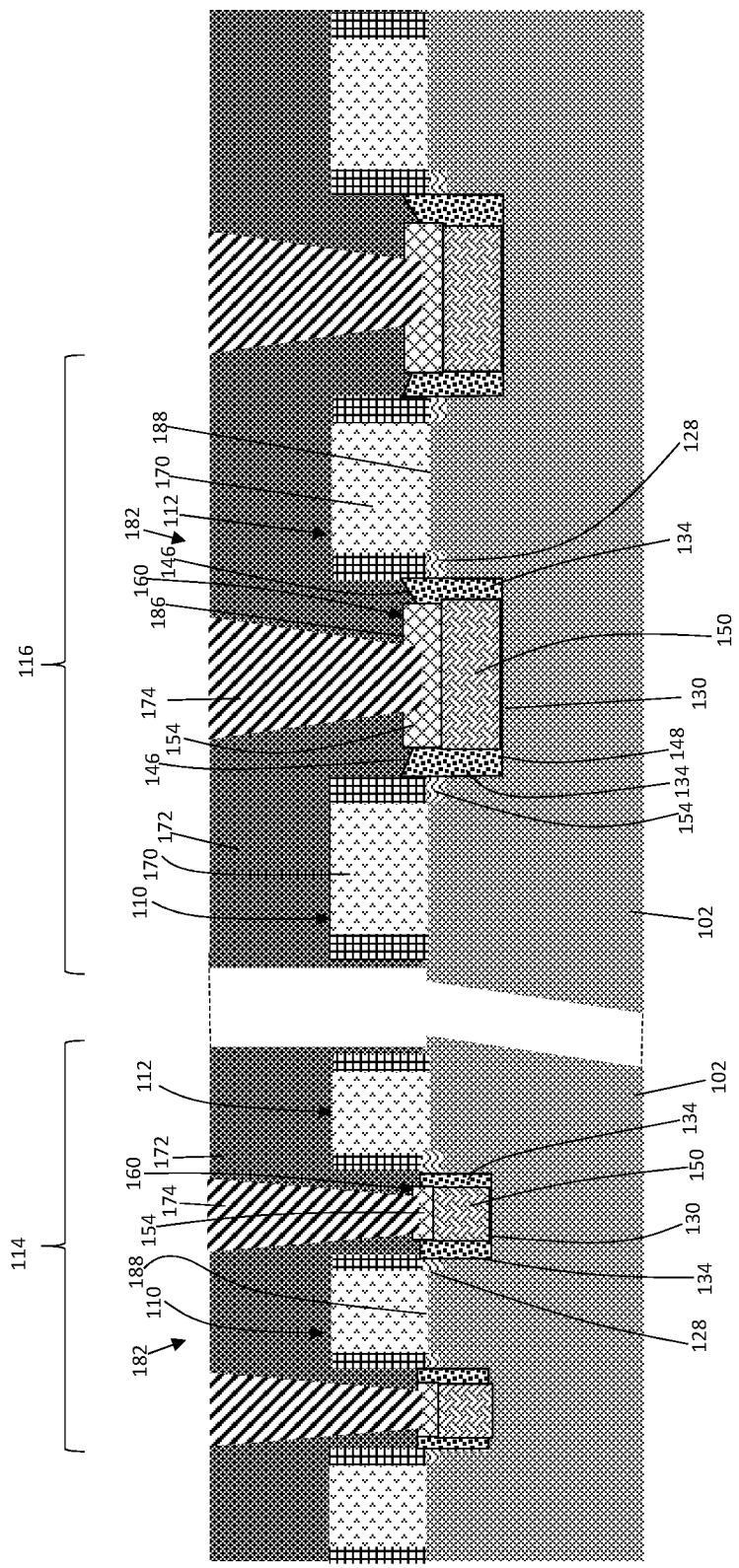
FIG. 9 shows a cross-sectional view of a structure for a FET including a three part source/drain region, according to embodiments of the disclosure.

FIG. 9 shows various conventional processing to complete FETs 182. For example, the method may optionally include removing mask 142 (FIG. 8), e.g., using an appropriate etch selective to the material of mask 142. Where an RMG process is employed, processing may include replacing the dummy gates with metal gates. The RMG process may include, for example, replacing dummy gate(s) bodies 120 (FIG. 1) over semiconductor body 102 with a metal gate 170. It is understood that dummy gates that are replaced with metal gate 170, create FETs 182 with gate structures 110, 112 and source/drain regions 160. The RMG process may start with a step commonly called "dummy gate pull." Dummy gate bodies 120 (FIG. 1) may be removed using any now known or later developed process. In one example, dummy gate bodies 120 are etched away. In this case, dummy gates bodies 120 may be removed, for example, by RIE. As understood in the art and not shown in FIG. 9 for clarity, metal gates 170 may include a gate region formed on a gate dielectric. The gate regions may include one or more conductive components for providing a gate terminal of a transistor 182. Metal gates 170 may include a high dielectric constant (high-K) layer, a work function metal layer and a gate conductor. High-K layer may include any now known or later developed high-K material typically used for metal gates 170 such as but not limited to: metal oxides such as tantalum oxide (Ta$_2$O$_5$), barium titanium oxide (BaTiO$_3$), hafnium oxide (HfO$_2$), zirconium oxide (ZrO$_2$), aluminum oxide (Al$_2$O$_3$) or metal silicates such as hafnium silicate oxide (Hf$_{A1}$Si$_{A2}$O$_{A3}$) or hafnium silicate oxynitride (Hf$_{A1}$Si$_{A2}$O$_{A3}$N$_{A4}$), where A1, A2, A3, and A4 represent relative proportions, each greater than or equal to zero and A1+A2+A3+A4 (1 being the total relative mole quantity). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap of, for example, a nitride may also be formed over the gate region.

FIG. 9 also shows forming an interlayer dielectric (ILD) 172 over gate structures 110, 112. ILD 172 may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). ILD 172 may include the same material as mask 142, thus eliminating the need to remove mask 142. FIG. 9 also shows forming a contact 174 over second semiconductor layer 154, i.e., to source/drain region 160. Contact 174 may be formed using any now known or later developed technique, e.g., patterning a mask (not shown), etching to create contact openings in ILD 172, and depositing a refractory metal liner and contact conductor, and planarizing.

Figure 10:
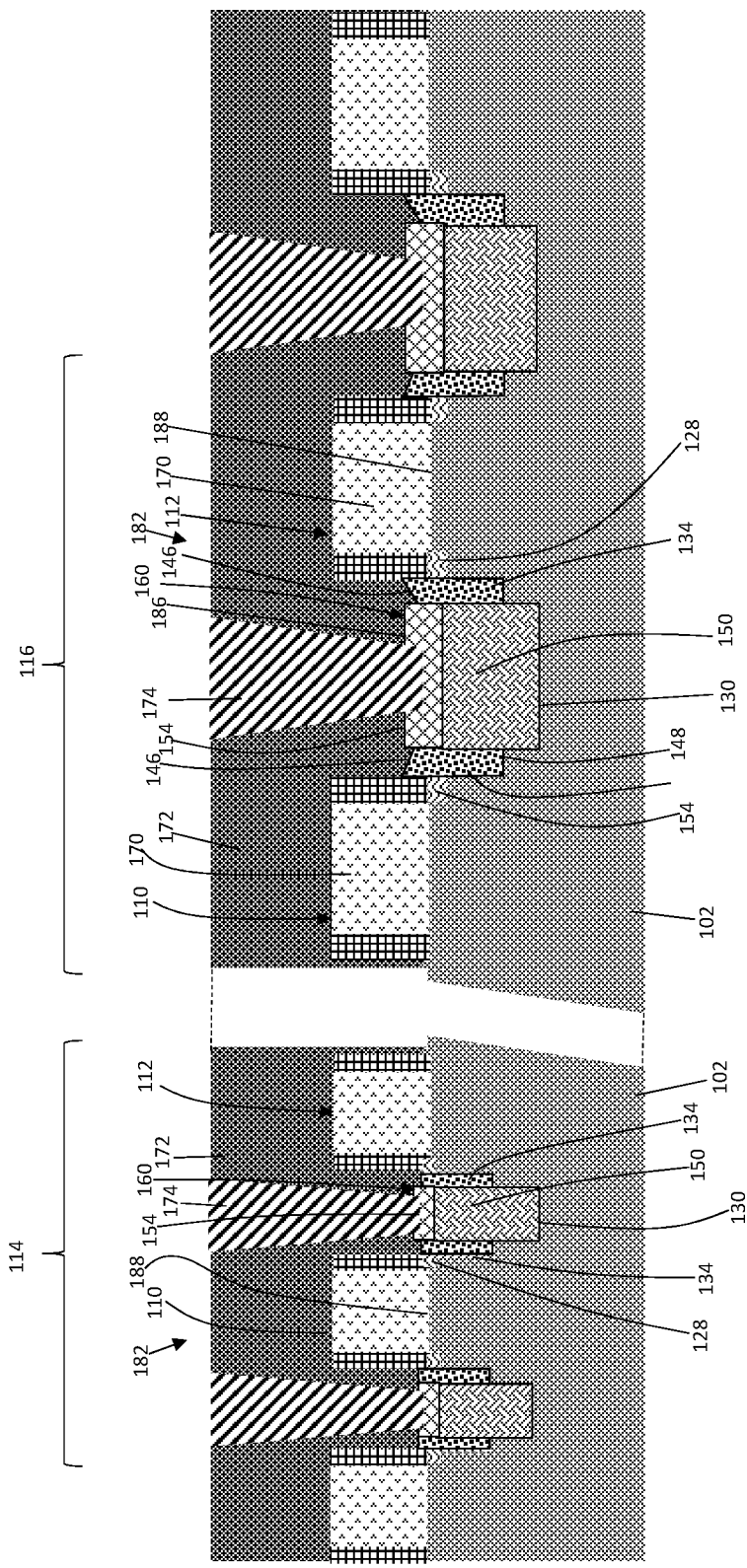
FIG. 10 shows a cross-sectional view of a structure for a FET including a three part source/drain region, according to other embodiments of the disclosure.

FIGS. 9 and 10 also show a structure for FET 182 and FETs 182, according to embodiments of the disclosure. Gate structures 110, 112 in each set of gate structures 114, 116 may share source/drain regions 160 therebetween. The structure includes semiconductor body 102, e.g., a semiconductor fin. The structure also include first gate structure 110 extending over semiconductor body 102, and second gate structure 112 extending over semiconductor body 102. Gate structures 110, 112 may include metal gates 170, as described herein. The structure also includes recess 130 in semiconductor body 102 between first and second gate structures 110. Pair of spaced semiconductor spacers 134 are in recess 130, and first semiconductor layer 150 is laterally between pair of semiconductor spacers 14. In FIG. 9, recess 130 and first semiconductor layer 150 extend to the depth shown in FIG. 5, and in FIG. 10, recess 130 and first semiconductor layer 150 extend to the depth shown in FIG. 6. In FIG. 10, first semiconductor layer 150 extends below a lower surface 148 of pair of spaced semiconductor spacers 134. FIG. 10 thus provides a greater source/drain region 160 volume. The structure also includes second semiconductor layer 154 over first semiconductor layer 150. Collectively, semiconductor spacers 134, first semiconductor layer 150 and second semiconductor layer 154 form a three part source/drain region 160.

As noted, pair of spaced semiconductor spacers 134 include a dopant at a first dopant concentration, first semiconductor layer 150 includes the dopant at a second dopant concentration, and second semiconductor layer 154 includes the dopant at a third dopant concentration. The first, second and third dopant concentrations may be all different. In one embodiment, the semiconductor spacers' 134 first dopant concentration is between $1 \times 10^{19}$ and $1 \times 10^{20}$ atoms/cm$^3$, the first semiconductor layer's 150 second dopant concentration is greater than $1 \times 10^{21}$ atoms/cm$^3$, and the second semiconductor layer's 154 third dopant concentration is less than $1 \times 10^{19}$ atoms/cm$^3$. In one non-limiting example, the dopant includes phosphorous (P). Hence, three part source/drain region 160 may include three different dopant concentrations.

In certain embodiments, second semiconductor layer 154 may be between pair of semiconductor spacers 134, but it may also extend above spacers 134. As shown in FIGS. 9 and 10, where underfill occurs as shown in FIG. 4, each of semiconductor spacers 134 may have an upper surface 146 at a non-perpendicular angle relative to a sidewall of an adjacent gate structure 110, 112. The angle of upper surfaces 146 can be determined based on the extent of underfill and the curvature of concave upper surface 138 (FIG. 4) of semiconductor member 136 (FIG. 4).

The structure may also include contact 174 over second semiconductor layer 154. Contacts (not shown) may also be made to gate structures 110, 112. Each gate structure 110, 112 may include gate spacer 122, and a doped section 126 in semiconductor body 102 may extend under each gate spacer 122 and laterally adjacent each of semiconductor spacers 134. An upper end (near upper surface 146) of each of the pair of spaced semiconductor spacers 134 and an upper surface 186 of second semiconductor layer 154 may be above an upper surface 188 of semiconductor body 102, thus potentially creating a raised portion of source/drain region 160. Upper surface 186 of second semiconductor layer 154 could also be below upper surface 188, e.g., embedded in semiconductor body 102.

Each dopant concentration of three part source/drain region 160 provides certain advantages. Semiconductor spacers 134 may provide improved short channel effect, and also create a decreased effective lateral spacing between gate structures 110, 112, e.g., by filling space between gate spacers 122 in recess 130. First semiconductor layer 150 provides lower contact resistance, e.g., by providing the necessary source/drain volume. Source/drain region 160 volume can be controlled by a depth of first semiconductor layer 150, the depth of etching to remove semiconductor member 136 (FIGS. 5-6), and the depth of second semiconductor layer 154. Second semiconductor layer 154 may provide improved epitaxial uniformity and improved effective capacitance, i.e., for the upper surface of source/drain region 160.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure for a field-effect transistor, the structure comprising:
a semiconductor body;
a first gate structure extending over the semiconductor body;
a second gate structure extending over the semiconductor body;
a recess defined in the semiconductor body between the first and second gate structures;
a pair of spaced semiconductor spacers in the recess;
a first semiconductor layer laterally between the pair of spaced semiconductor spacers, wherein the first semiconductor layer extends below a lower surface of the pair of spaced semiconductor spacers; and
a second semiconductor layer over the first semiconductor layer.

2. The structure of claim 1, wherein the pair of spaced semiconductor spacers include a dopant at a first dopant concentration, the first semiconductor layer includes the dopant at a second dopant concentration, and the second semiconductor layer includes the dopant at a third dopant concentration, wherein the first, second and third dopant concentrations are all different.

3. The structure of claim 2, wherein the first dopant concentration is between $1\times10^{19}$ and $1\times10^{20}$ atoms per cubic centimeter (atoms/cm$^3$), the second dopant concentration is greater than $1\times10^{21}$ atoms/cm$^3$, and the third dopant concentration is less than $1\times10^{19}$ atoms/cm$^3$.

4. The structure of claim 1, wherein the second semiconductor layer is between the pair of spaced semiconductor spacers.

5. The structure of claim 1, wherein each of the pair of spaced semiconductor spacers has an upper surface at a non-perpendicular angle relative to a sidewall of an adjacent gate structure.

6. The structure of claim 1, further comprising a contact over the second semiconductor layer.

7. The structure of claim 1, wherein each gate structure includes a gate spacer, and further comprising a doped section in the semiconductor body under each gate spacer and laterally adjacent each of the pair of spaced semiconductor spacers.

8. The structure of claim 1, wherein an upper end of each of the pair of spaced semiconductor spacers and an upper surface of the second semiconductor layer are above an upper surface of the semiconductor body.

9. The structure of claim 1, wherein the pair of spaced semiconductor spacers, the first semiconductor layer and the second semiconductor layer each include epitaxially grown semiconductor.

10. A field-effect transistor (FET), comprising:
a semiconductor body;
a gate structure extending over the semiconductor body;
a recess defined in the semiconductor body adjacent the gate structure;
a source/drain region in the recess, the source/drain region including:
a pair of spaced semiconductor spacers in the recess, the pair of spaced semiconductor spacers having a first dopant concentration;
a first semiconductor layer laterally between the pair of spaced semiconductor spacers, the first semiconductor layer having a second dopant concentration greater than the first dopant concentration; and
a second semiconductor layer over the first semiconductor layer, the second semiconductor layer having a third dopant concentration less than the first dopant concentration.

11. A method of forming a structure for a field effect transistor, the method comprising:
forming a first gate structure and a second gate structure extending over a semiconductor body, the first gate structure laterally spaced from the second gate structure;
forming a recess in the semiconductor body between the first and second gate structures;
forming a pair of spaced semiconductor spacers in the recess and between the first and second gate structures;
forming a first semiconductor layer laterally between the pair of spaced semiconductor spacers, wherein the first semiconductor layer extends below a lower surface of the pair of spaced semiconductor spacers; and
forming a second semiconductor layer over the first semiconductor layer.

12. The method of claim 11, wherein forming the pair of spaced semiconductor spacers includes:
epitaxially growing a semiconductor member in the recess;
forming a mask along sidewalls of the first and second gate structures; and
etching to remove an exposed portion of the semiconductor member and form the pair of spaced semiconductor spacers.

13. The method of claim 12, wherein the etching to remove the exposed portion of the semiconductor member includes etching below a lower surface of the pair of spaced semiconductor spacers.

14. The method of claim 12, wherein the semiconductor member has a concave upper surface, and each of the pair of spaced semiconductor spacers has an upper surface at a non-perpendicular angle relative to a sidewall of an adjacent gate structure.

15. The method of claim 11, wherein forming the first semiconductor layer and forming the second semiconductor layer includes epitaxially growing each layer.

16. The method of claim 11, wherein forming the pair of spaced semiconductor spacers includes doping at a first dopant concentration, forming the first semiconductor layer includes doping at a second dopant concentration greater than the first dopant concentration, and forming the second semiconductor layer includes doping at a third dopant concentration less than the first dopant concentration.

17. The method of claim 16, wherein the first dopant concentration is between $1\times10^{19}$ and $1\times10^{20}$ atoms per cubic centimeter (atoms/cm$^3$), the second dopant concentration is greater than $1\times10^{21}$ atoms/cm$^3$, and the third dopant concentration is less than $1\times10^{19}$ atoms/cm$^3$.

18. The method of claim 11, further comprising:
prior to forming the recess, doping the semiconductor body with a dopant between the first and second gate structures to form a source/drain region, wherein each gate structure includes a gate spacer, and the dopant of the source/drain region extends under each gate spacer and laterally adjacent each of the pair of semiconductor spacers.

19. The FET of claim 10, wherein the first semiconductor layer extends below a lower surface of the pair of spaced semiconductor spacers.

* * * * *